United States Patent [19]

Campisi et al.

[11] 4,398,236

[45] Aug. 9, 1983

[54] PC BOARD MOUNTING APPARATUS

[75] Inventors: Carl Campisi, Chicago; Harry F. Sron, Schaumberg, both of Ill.

[73] Assignee: Zenith Radio Corporation, Glenview, Ill.

[21] Appl. No.: 239,291

[22] Filed: Mar. 2, 1981

[51] Int. Cl.³ .............................................. H05K 7/12
[52] U.S. Cl. .................................... 361/419; 361/399; 361/420; 361/427
[58] Field of Search ............... 361/391, 399, 412, 415, 361/417, 418, 419, 420, 427

[56] References Cited

U.S. PATENT DOCUMENTS

| | | | |
|---|---|---|---|
| 3,376,479 | 4/1968 | Wines | 361/391 |
| 3,811,154 | 5/1974 | Lindeman | 361/412 X |
| 3,829,741 | 8/1974 | Athey | 361/412 X |
| 3,899,721 | 8/1975 | Borchard et al. | 361/415 |
| 3,983,459 | 9/1976 | Passler | 361/415 |
| 4,002,953 | 1/1977 | Tetlie | 361/415 |
| 4,019,099 | 4/1977 | Calabra | 361/399 |
| 4,161,017 | 7/1979 | Pierce et al. | 361/412 |
| 4,226,491 | 10/1980 | Kazama et al. | 361/399 |
| 4,232,356 | 11/1980 | Saunders | 361/415 |
| 4,327,835 | 5/1982 | Leger | 361/399 X |

Primary Examiner—R. R. Kucia
Attorney, Agent, or Firm—Jack Kail

[57] ABSTRACT

A pair of elongate rail members are secured along opposed edges of a printed circuit board for protecting the solder fillets formed on the foil side of the board and to facilitate convenient screwless mounting of the printed circuit board to a substantially flat platform of a television receiver chassis or the like. Each rail member comprises a printed circuit board supporting surface and a substantially flat base adapted for mounting on the platform, the base being spaced from the supporting surface by a distance greater than the length of the solder fillets. The rail members are secured to the printed circuit board by resilient tabs which snap lock the foil surface of the board in abutment with the supporting surface. At least one locking member depends from the base of each rail and is received for limited longitudinal movement within an elongate slot formed in the platform, the locking members and base forming a bite for capturing an edge of the platform at one limit of longitudinal movement. The back cover of the chassis includes internal projections bearing against the rails to prevent movement away from the limiting position.

5 Claims, 7 Drawing Figures

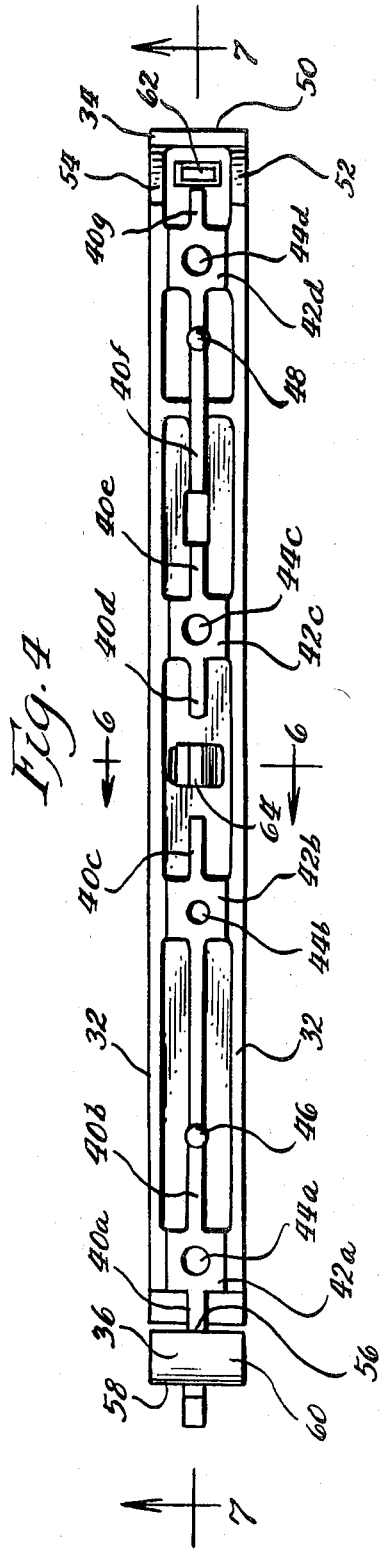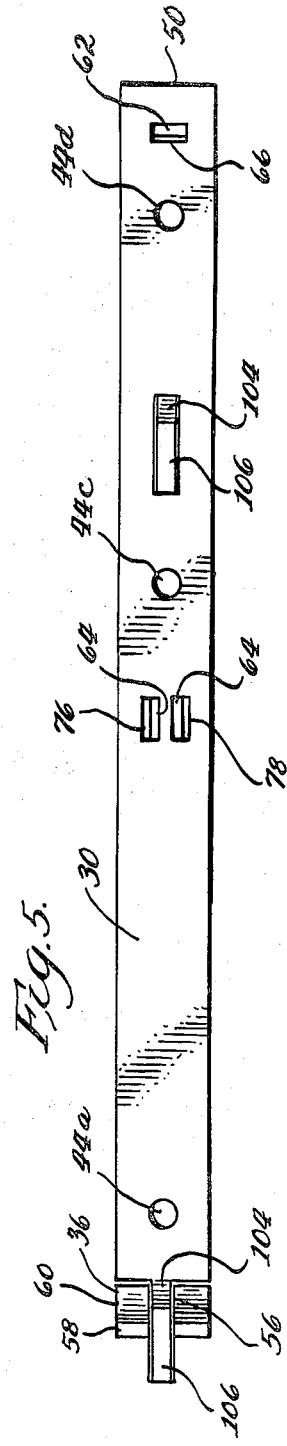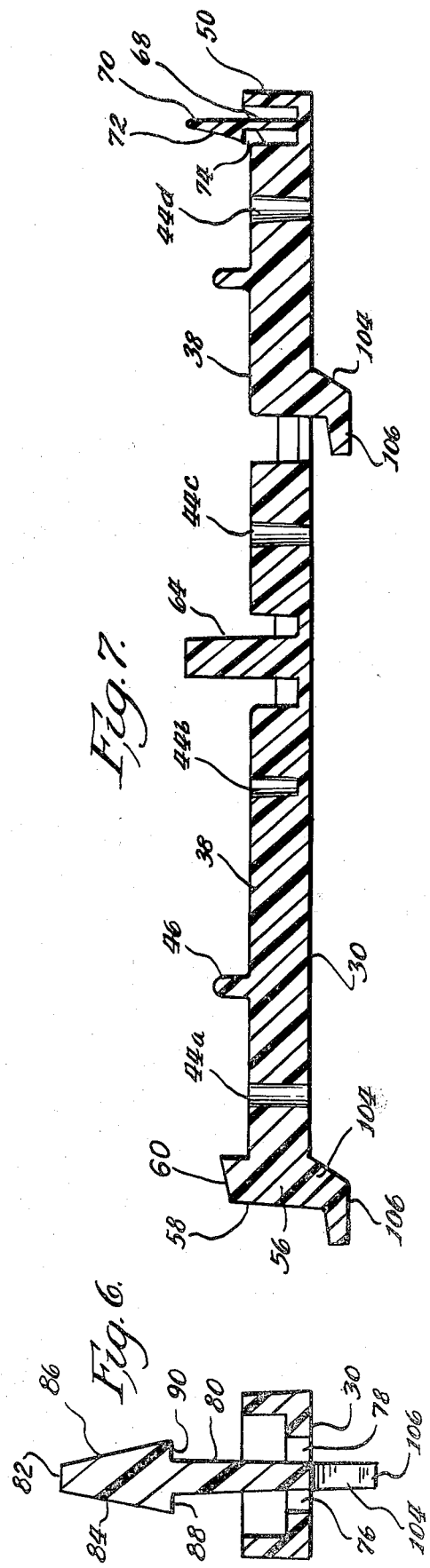

PC BOARD MOUNTING APPARATUS

BACKGROUND OF THE INVENTION

The present invention relates generally to printed circuit board mounting apparatus and, more particularly, to apparatus which is adapted for being attached to a printed circuit board for protecting the solder fillets formed on the foil side thereof and, at the same time, facilitating the convenient screwless mounting of the board to a platform such as the bottom shelf of a television receiver or the like.

Printed circuit boards typically comprise a flat plate-like structure having a top surface on which is mounted a plurality of electronic components, the leads of the components extending through holes formed in the board and soldered to conductive paths formed on the foil or bottom surface of the board. The soldering process creates a plurality of solder fillets, sometimes referred to as "icicles," which depend from the foil or bottom surface of the printed circuit board and form both an electrical as well as a rather fragile mechanical connection between the component leads and the foil conductive paths. Thus, during the handling of assembled printed circuit boards it is not uncommon to find that one or more of the solder fillets have become damaged or broken as a result of, for example, placing the printed circuit board foil side down on a table or other flat surface. This may break the electrical connection established by the solder fillet thereby rendering the electronic circuitry mounted on the printed circuit board partly or wholly inoperative.

These problems are especially prevalent in industries such as the manufacture of television receivers where the printed circuit boards are typically assembled at a sub-assembly plant and then transported to a final assembly plant for mounting on the chassis of a television receiver. Thus, before being mounted in the receiver, the printed circuit board may be handled at a number of locations and by a number of people, each handling operation exposing the solder fillets to possible damage. Furthermore, after mounting the printed circuit board in the receiver, it is often necessary to remove the board for field service again exposing the solder fillets to possible damage.

The mounting of the assembled printed circuit boards on the television receiver chassis also presents certain problems. Conventionally, the boards are mounted on a flat shelf or platform in the receiver with a plurality of suitable screws being used to secure the printed circuit board to the mounting shelf. While not an extremely difficult assembly operation, this multiple screw fastening technique is relatively expensive from a labor and material viewpoint. In addition, the possibility always exists for one or more of the mounting screws to drop and be lost within the receiver resulting in a potentially harmful short circuit condition.

In view of the foregoing, it is a basic object of the present invention to provide novel apparatus which serves to protect a printed circuit board during handling thereof.

It is a more specific object of the invention to provide novel apparatus of the foregoing type which particularly serves to protect the mechanical integrity of the solder fillets formed on the foil surface of a printed circuit board during handling and transportation of the board.

It is an additional object of the invention to provide novel printed circuit board protection apparatus which further serves to facilitate the convenient screwless mounting of the circuit board on a mounting shelf or platform of a television receiver or the like.

In accordance with these and other useful objects, the present invention contemplates the provision of a novel snap action plastic rail, one such rail being attached to each of a pair of opposed edges of an assembled printed circuit board so as to space the foil surface of the board for protection from damage when placed on a flat surface. The rails include depending hooks or locking feet which, when slid and locked into retaining slots formed in a mounting platform, serve to securely fasten the printed circuit board to the mounting platform.

BRIEF DESCRIPTION OF THE DRAWINGS

The features of this invention which are believed to be novel are set forth with particularity in the appended claims. The invention, together with its objects and the advantages thereof, may best be understood by reference to the following description taken in conjunction with the accompanying drawings, in which like reference numerals identify like elements in the several Figures and in which:

FIG. 4 is a top plan view of the mounting rail shown in FIG. 3;

FIG. 5 is a bottom plan view of the mounting rail shown in FIG. 3;

FIG. 6 is a sectional view taken along lines 6—6 of FIG. 4; and

FIG. 7 is a sectional view taken along line 7—7 of FIG. 4.

DESCRIPTION OF THE PREFERRED EMBODIMENT

Figure 1:
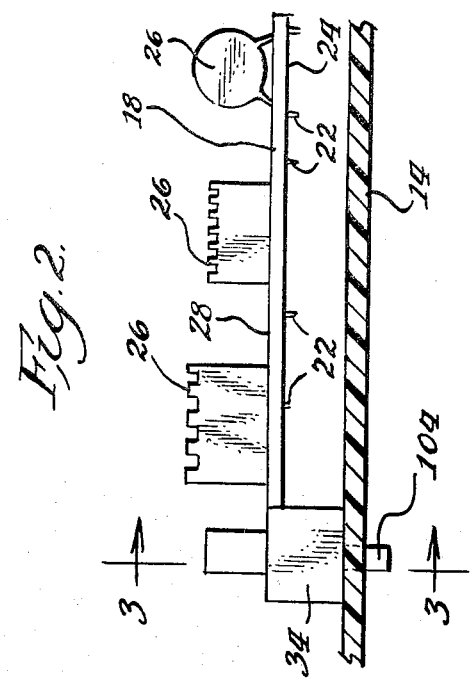
FIG. 1 is a perspective view of a partially assembled television receiver illustrating the use of the mounting rails of the invention to mount a printed circuit board on the bottom shelf of the receiver.
Figure 2:
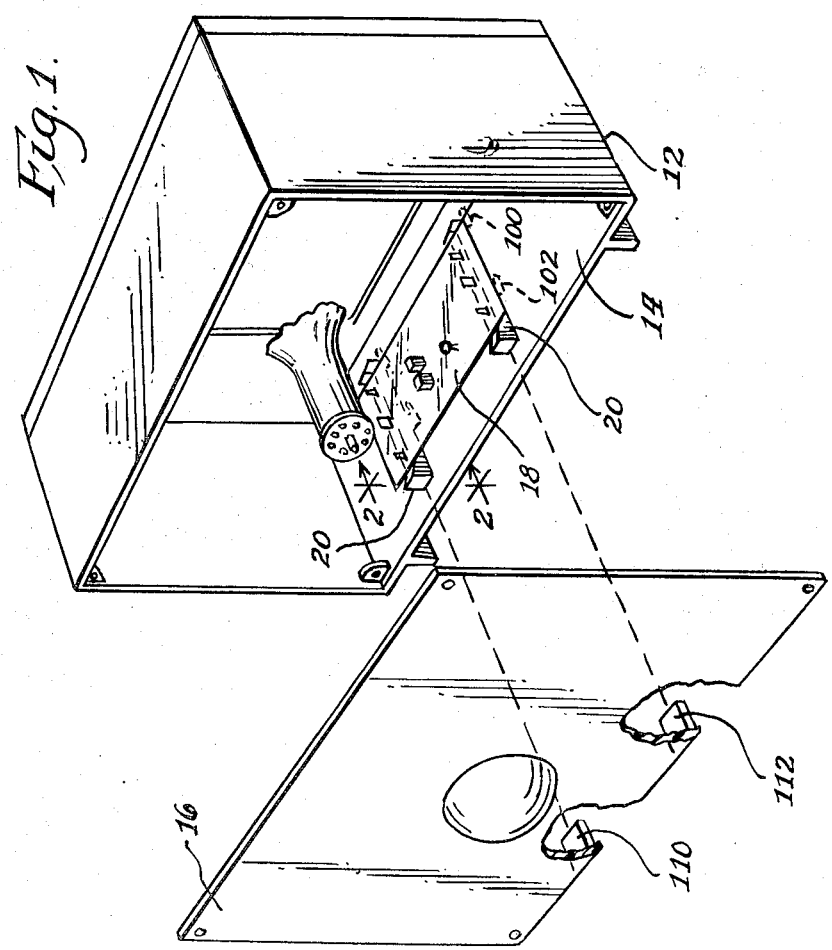
FIG. 2 is a view taken along line 2—2 of FIG. 1.
Figure 3:
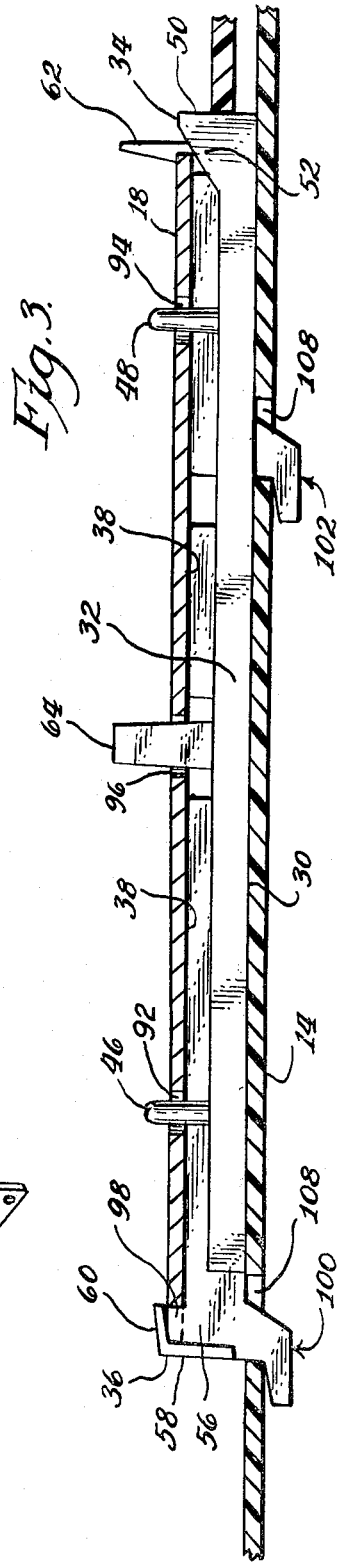
FIG. 3 is a side elevation view of one of the mounting rails of FIG. 1.

Referring to the drawings and, in particular, to FIGS. 1 and 2, the novel printed circuit board protection and mounting apparatus of the invention is illustrated for use in association with a conventional television receiver which includes a cabinet 12, a substantially flat horizontally disposed printed circuit board mounting platform or shelf 14 and a removable back cover 16. While the invention is illustrated and will hereinafter be described in connection with a television receiver, it is to be understood such is being done for exemplary purposes only and should therefore not be taken to impose any limitations on the invention. Thus, in general, the apparatus of the invention is equally applicable for use in association with printed circuit boards intended for mounting on a flat mounting platform forming part of any type of electronic system.

With further reference to FIGS. 1 and 2, a printed circuit board 18 is mounted on platform 14 by means of a pair of snap action mounting rails 20, the mounting rails being attached to the printed circuit board along a pair of opposed edges thereof. In use, rails 20 are typically attached to the printed circuit board after its assembly at a sub-assembly plant and thereafter accompany the board which is transported to a final assembly plant for mounting in the television receiver. Thus, before the printed circuit board is actually mounted in the television receiver, it may be handled by a number of people exposing it to possible damage. In particular, the printed circuit board includes a plurality of solder fillets 22 depending from the foil or underneath surface 24 of the board which serve to electrically connect the leads of the components 26 mounted on the top surface 28 of the board and which also form a relatively fragile mechanical connection between components 26 and the printed circuit board. Rails 20 are attached to the printed circuit board so as to advantageously provide a clearance space between solder fillets 22 and any flat surface upon which the board may be placed to protect the fillets and the fragile mechanical connection formed thereby from damage. In addition to protecting the solder fillets 22 during handling of the printed circuit board, rails 20 are further adapted for facilitating the screwless mounting of the board on platform or shelf 14, the board and rail assembly being easily removable, if necessary, from its mounted position to allow servicing or the like thereof. Of course, during servicing of the printed circuit board, rails 20 will again function to protect solder fillets 22 by maintaining the fillets spaced above the surface of the work table.

The rails 20, both of which are identical, are shown in detail in FIGS. 3-7. Each rail 20, which preferably comprises a unitary plastic molded structure, includes a flat generally rectangular elongate base 30 adapted to be seated in abutting relation on mounting platform 14. A pair of opposed longitudinally extending side walls 32 project upwardly from base 30 and terminate at one distal end in a bearing member 34 and at the opposite distal end in a stop member 36. A substantially flat printed circuit board supporting surface 38 is longitudinally disposed intermediate opposed side walls 32 in spaced parallel relation with base 30 and formed by a series of ribs and bosses which project upwardly from base 30. In particular, printed circuit board supporting surface 38, which extends between bearing member 34 and stop member 36, is formed by the exterior or outwardly facing surfaces of a plurality of longitudinal rib portions 40a–40g together with the exterior or upwardly facing surfaces of spaced bosses 42a–42d, both rib portions 40a–40g and bosses 42a–42d extending upwardly from base 30 intermediate side walls 32. Bosses 42a, 42c and 42d each includes a respective aperture 44a, 44c and 44d, which apertures extend through the bosses and also through underlying base 30. Boss 42b includes an aperture 44b which extends through the boss but not through base 30. A first locating pin 46 extends upwardly from base 30 through rib portion 40b and projects beyond printed circuit board supporting surface 38 while a second similar locating pin 48 extends upwardly from base 30 through rib portion 40f and also projects beyond printed circuit board supporting surface 38.

Bearing member 34 comprises a transverse bearing surface or wall 50 extending upwardly from base 30 slightly beyond printed circuit board supporting surface 38 and intermediate a pair of opposed side wall extensions 52 and 54, the upper surfaces of extensions 52 and 54 forming a pair of inclined ledges between the top surfaces of side walls 32 and bearing wall 50. As will be explained in further detail hereinafter, bearing wall 50 is adapted for receiving a longitudinally applied force to lock rails 20 in place when used for mounting a printed circuit board on platform 14. Stop member 36 comprises a guide member 56 extending longitudinally from rib portion 40a and base 30, guide member 56 projecting above printed circuit board supporting surface 38 and carrying a generally L-shaped structure the legs of which form a transverse stop wall 58 and a retaining wall 60 which is slightly inclined relative to the plane of supporting surface 38.

Each of the rails 20 further comprises a pair of snap actions tabs 62 and 64 which project upwardly from base 30 and facilitate the attachment of the rails to a printed circuit board. Tab 62, which is disposed adjacent a perforation 66 formed in base 30 and intermediate side wall extensions 52 and 54 of bearing member 34, comprises a transverse plate-like leg 68 projecting upwardly from base 30, leg 68 carrying a head member 70 which includes an interior facing surface 72 inclined so as to form a transverse shoulder 74 between leg 68 and head member 70. Transverse shoulder 74 of tab 62 is spaced above printed circuit board supporting surface 38 by an amount approximately equal to the thickness of printed circuit board 18 and is movable longitudinally of rail 20 by bending tab 62 from its normal position shown in the drawings. Tab 64 (see FIG. 6), which is disposed intermediate rib portions 40c and 40d and between a pair of perforations 76 and 78 formed in base 30 comprises a longitudinally disposed plate-like leg 80 projecting upwardly from base 30, leg 80 carrying a head member 82 which includes a pair of opposed surfaces 84 and 86 inclined in opposite directions so as to form a pair of longitudinal shoulders 88 and 90 between leg 80 and head member 82. Longitudinal shoulders 88 and 90 are also spaced above printed circuit board supporting surface 38 by an amount approximately equal to the thickness of printed circuit board 18 and are movable transversely of rail 20 by bending tab 64 from its normal position shown in the drawings.

In order to facilitate the attachment of printed circuit board 18 to rails 20 the board is prepared by forming, along each of two opposing edges thereof, a pair of elongate locating slots 92 and 94, a central notch 96 and an elongate guide slot 98. One rail 20 is attached to each printed circuit board edge by guiding guide member 56 of stop member 36 into guide slot 98 until the printed circuit board engages stop wall 58. Tabs 62 and 64 are then bent away from the printed circuit board allowing locating pins 46 and 48 to pass through locating slots 92 and 94 and tab 64 to pass upwardly through notch 96. Tabs 62 and 64 are now released and snap back to their normal positions where printed circuit board 18 is captured between transverse shoulder 74, one of the longitudinal shoulders 88 and 90 and printed circuit board supporting surface 38. The rails 20 are thereby securely attached to the opposed edges of the printed circuit board whose foil side 24 is firmly seated upon supporting surface 38. Longitudinal movement of the rails relative to the printed circuit board is inhibited on one side by stop wall 58 and on the other side by tab 62 while vertical movement is inhibited by retaining wall 60 as well as by the shoulders of the tabs. Transverse movement of the rails is limited by guide member 56 together with tab 64 and locating pins 46 and 48. It will be appreciated that since printed circuit board supporting surfaces 38 of rails 20 are spaced above bases 30, the foil or bottom surface 25 of the printed circuit board will likewise be maintained at a spaced distance above the rail bases. Therefore, when the assembly is placed on a flat surface during any handling operation the solder fillets depending from surface 24 will be substantially spaced therefrom and thereby protected from damage. Also, it will be appreciated that should the need arise to remove rails 20 from printed circuit board 18 this may be conveniently accomplished by bending tabs 62 and 64 away from the printed circuit board allowing the rails to drop downwardly and then sliding guide members 56 away from the board and out of guide slots 98.

Each of the rails 20 also includes a pair of mounting feet 100 and 102 depending from base 30. Each of the mounting feet comprises a downwardly extending vertically disposed portion 104 and a horizontally disposed portion 106 extending therefrom and defining, together with base 30, a bite adapted for interfacing with mounting platform 14. That is, mounting platform 14 includes a plurality of elongate retaining slots 108 each adapted for receiving one of the depending mounting feet of rails 20. The rails 20, and the printed circuit board attached thereto, are mounted on the platform by dropping mounting feet 100 and 102 through appropriate ones of the retaining slots 108 such that base 30 is seated in abutting relation on the platform. Rails 20 are then slid forwardly until the edges of the retaining slots contact vertical portions 104 of the mounting feet so that the mounting platform is captured within the bites defined by the locking feet and base of the rails. In order to prevent rails 20 from backing away from this catured position, back cover 16 includes a pair of inwardly extending ribs 110 and 112 which, when back cover 16 is fastened to cabinet 12, bear against bearing wall 50 of bearing member 34. In this manner, the rails and circuit board are firmly locked in position on mounting platform 14 without the necessity of employing any screws or other similar fastening devices. However, if desired, suitable screws or the like can be inserted through apertures 44a-44d formed in bosses 42a-44d to further secure the rails to the printed circuit board and to the mounting platform.

While particular embodiments of the invention have been shown and described, it will be obvious to those skilled in the art that changes and modifications may be made without departing from the invention in its broader aspects. The aim in the appended claims, therefore, is to cover all such changes and modifications as fall within the true spirit and scope of the invention.

What is claimed is:

1. Apparatus for facilitating the handling of a printed circuit board and for mounting the printed circuit board on a platform, said printed circuit board comprising a first surface carrying a plurality of electric components and a second opposed surface forming a plurality of conductive paths to which the leads of said components are electrically connected by a plurality of solder fillets, said apparatus comprising an elongate rail member having a substantially flat base adapted for mounting on said platform, a pair of opposed longitudinally disposed side walls extending upwardly from said base, a series of longitudinally disposed rib and boss means extending upwardly from said base and intermediate said side walls, the upwardly facing surfaces of said side walls and rib and boss means forming a longitudinal supporting surface for abbutingly receiving the second surface of the printed circuit board along an edge thereof such that said base is maintained in spaced relation below said supporting surface at a distance greater than the extent to which said solder fillets depend from said printed circuit board second surface, said apparatus further comprising a first snap action tab transversely disposed intermediate said side walls and extending upwardly from said base near one distal end thereof and a second snap action tab longitudinally disposed intermediate said side walls and extending upwardly from said base near the longitudinal center thereof, said first and second snap action tabs being adapted for longitudinal and transverse deflection respectively for engaging the first surface of the printed circuit board along respective adjacent edges thereof so as to snap lock the second surface of said printed circuit board in abutment with said printed circuit board supporting surface.

2. Apparatus according to claim 1 wherein said platform defines an elongate slot passing therethrough and wherein said rail member includes locking means depending from said base and receivable for limited longitudinal movement within said elongate slot so as to secure said rail member to said platform at one limit of its longitudinal movement within said elongate slot.

3. Apparatus according to claim 2 wherein said locking means comprises means cooperating with said base for forming a bite adapted for capturing an edge of said platform formed at one of the distal ends of said elongate slot.

4. Apparatus according to claim 2 wherein said elongate rail member includes a first end comprising a bearing surface adapted for receiving a longitudinally applied force for maintaining said locking means at said one limit of its longitudinal movement within said elongate slot.

5. Apparatus according to claim 1 wherein each of said first and second tabs comprise a shoulder spaced above said printed circuit board supporting surface for capturing an edge of said printed circuit board between said shoulder and said printed circuit board supporting surface and being resiliently urgeable away from said edge for releasing said printed circuit board.

* * * * *